United States Patent
Yee et al.

(10) Patent No.: US 6,882,196 B2
(45) Date of Patent: Apr. 19, 2005

(54) DUTY CYCLE CORRECTOR

(75) Inventors: Gin Yee, Sunnyvale, CA (US); Sudhakar Bobba, Sunnyvale, CA (US); Claude Gauthier, Fremont, CA (US); Dean Liu, Sunnyvale, CA (US); Lynn Ooi, Santa Clara, CA (US); Pradeep Trivedi, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/198,453

(22) Filed: Jul. 18, 2002

(65) Prior Publication Data

US 2004/0012428 A1 Jan. 22, 2004

(51) Int. Cl.⁷ .................................................. H03K 3/017
(52) U.S. Cl. .................... 327/175; 327/176; 327/299
(58) Field of Search ................................ 327/172–176, 327/99, 152–155, 158, 159, 161, 270–272, 276, 284, 291, 293, 294, 299

(56) References Cited

U.S. PATENT DOCUMENTS

| | | | | | |
|---|---|---|---|---|---|
| 4,623,846 A | * | 11/1986 | LaMacchia | ................. | 327/114 |
| 4,807,266 A | * | 2/1989 | Taylor | ........................ | 377/48 |
| 5,317,202 A | * | 5/1994 | Waizman | ..................... | 327/156 |
| 5,410,263 A | * | 4/1995 | Waizman | ..................... | 327/141 |
| 5,491,440 A | * | 2/1996 | Uehara et al. | ............... | 327/172 |
| 5,617,563 A | * | 4/1997 | Banerjee et al. | ............. | 395/566 |
| 5,638,016 A | * | 6/1997 | Eitrheim | ..................... | 327/175 |
| 5,642,068 A | * | 6/1997 | Wojcicki et al. | ............ | 327/172 |
| 5,757,218 A | * | 5/1998 | Blum | ......................... | 327/175 |
| 5,815,023 A | * | 9/1998 | Webber et al. | .............. | 327/407 |
| 5,883,534 A | | 3/1999 | Kondoh et al. | ............. | 327/156 |
| 5,963,071 A | | 10/1999 | Dowlatabadi | ............... | 327/175 |
| 6,064,278 A | * | 5/2000 | Tanizawa | .................... | 332/109 |
| 6,239,627 B1 | * | 5/2001 | Brown et al. | ................ | 327/175 |
| 6,262,616 B1 | * | 7/2001 | Srinivasan et al. | .......... | 327/264 |
| 6,320,437 B1 | * | 11/2001 | Ma | ............................. | 327/175 |
| 6,320,438 B1 | * | 11/2001 | Arcus | .......................... | 327/175 |
| 6,326,827 B1 | * | 12/2001 | Cretti et al. | ................. | 327/175 |
| 6,426,660 B1 | * | 7/2002 | Ho et al. | ..................... | 327/175 |
| 6,452,432 B1 | * | 9/2002 | Kim | ........................... | 327/158 |
| 6,459,314 B1 | * | 10/2002 | Kim | ........................... | 327/161 |
| 6,509,771 B1 | * | 1/2003 | Atallah et al. | .............. | 327/175 |
| 6,566,925 B1 | * | 5/2003 | Ma | ............................. | 331/1 A |
| 6,603,337 B1 | * | 8/2003 | Cho | ............................ | 327/149 |

* cited by examiner

*Primary Examiner*—Timothy P. Callahan
*Assistant Examiner*—Hai L. Nguyen
(74) *Attorney, Agent, or Firm*—Osha & May L.L.P.

(57) ABSTRACT

A device that uses an input clock signal to generate an output clock signal with a desired frequency is provided. The device uses a voltage controlled delay element that outputs a reset signal to a flip-flop dependent on a bias signal and the input clock signal. When triggered, the flip-flop outputs a transition on the output clock signal, which, in turn, serves as an input to a duty cycle corrector that generates the bias signal dependent on the configuration of the duty cycle corrector. The duty cycle corrector may be configured to generate the bias signal so as to be able to operatively control the duty cycle of the output clock signal.

15 Claims, 7 Drawing Sheets

DUTY CYCLE CORRECTOR

BACKGROUND OF INVENTION

A typical computer system includes at least a microprocessor and some form of memory. The microprocessor has, among other components, arithmetic, logic, and control circuitry that interpret and execute instructions necessary for the operation and use of the computer system. FIG. 1 shows a typical computer system (10) having a microprocessor (12), memory (14), integrated circuits (16) that have various functionalities, and communication paths (18, 20), i.e., buses and wires, that are necessary for the transfer of data among the aforementioned components of the computer system (10).

A clock signal is critical to the operation of a microprocessor-based computer system. The clock signal initiates and synchronizes the operation of almost all of the components of the typical computer system. As computers operate at increasing clock speeds, it becomes critical to ensure that clock signals on a microprocessor are provided to various logic elements on the microprocessor in an accurate and timely manner. However, due to one or more types of variations in fabrication, temperature, and voltage, clock signals may not arrive at various logic elements as expected.

Two components used within the computer system (10) to ensure clock signals arrive in an accurate and timely manner are a phase locked loop, or "PLL," and a delay locked loop, or "DLL." Both PLL and DLL circuits remove clock distribution delay. The PLL is an electronic circuit that controls an oscillator such that the oscillator maintains a constant phase relative to a system signal. The DLL is an electronic circuit that generates a copy of the clock signal at a fixed phase shift from the original clock signal.

The performance of PLL and DLL circuits are measured by characteristics of the clock signals, e.g., jitter, noise, and duty cycle. Duty cycle is the relationship between the high state time (high time) and low state time (low time). For example, if the high time of the signal is three quarters of each cycle, the duty cycle of the high time is 75%. If the high time of the signal is half of each cycle, the duty cycle of the high time is 50%. Commonly, components dependent upon output signals and input signals, particularly clock signals, require a 50% duty cycle. However, due to the variations mentioned above, the high times of a signal and the low times of the signal may not always be equal.

An approach designers have used to achieve a 50% duty cycle is the use of a frequency divider. The frequency divider may be integrated in the PLL or DLL design, or in other implementations, may precede or follow PLL and DLL circuits. FIG. 2 shows a typical frequency divider. The frequency divider (30) includes an inverter (32) and a positive edge triggered flip-flop (34). The inverter (32) inputs an output clock signal (clk 2). The flip-flop (34) inputs the inverted output clock signal to an input data terminal (D) of the flip-flop (34) and an input clock signal (clk 1) to a clock terminal (CLK) of the flip-flop (34).

An output terminal (Q) maintains the present state until the clock terminal (CLK) is triggered. The output terminal (Q) of the flip-flop (34) transitions from the previous state when the clock terminal (CLK) is triggered (i.e., transitions to high). For example, if the output terminal (Q) is low and the input data terminal (D) is high and the clock terminal (CLK) transitions to high, the output terminal (Q) transitions to high. When the clock terminal (CLK) transitions to low, the output terminal (Q) maintains the high state and the input data terminal (D) maintains the low state. The output terminal (Q) transitions to low when the clock terminal (CLK) transitions to high again.

FIG. 3 shows a timing diagram of the typical frequency divider shown in FIG. 2. FIG. 3 illustrates two defining characteristics of the frequency divider (30). First, the frequency divider (30) produces the output clock signal (clk 2) with a 50% duty cycle, even if the input clock signal (clk 1) doesn't have a 50% duty cycle. Second, a frequency of the output clock signal (clk 2) is half of the frequency of the input clock signal (clk 1). Further, the output clock signal (clk 2) is substantially delayed relative to the input clock signal (clk 1). The output clock signal (clk 2) transitions (high to low or low to high) for every rising edge of the input clock signal (clk 1). In this manner, the 50% duty cycle of the output clock signal (clk2) and halved frequency of the output clock signal (clk 2) (with respect to input clock signal (clk 1)) are generated. The frequency divider (30) cannot generate a duty cycle other than the 50% duty cycle.

SUMMARY OF INVENTION

According to one aspect of the invention, a duty cycle correction device for generating a output clock signal with a desired duty cycle based on an input clock signal comprises: a pulse generator that inputs the input clock signal and generates a reset signal; a voltage controlled delay element that inputs the reset signal and a bias signal and generates a modified reset signal; a clock signal adjustment device configured to generate the output clock signal, where the clock adjustment device is responsive to the modified reset signal and the input clock signal; and a duty cycle controller that inputs the output clock signal and generates the bias signal therefrom.

According to another aspect, a method for generating an output clock signal with a desired duty cycle based on an input clock signal comprises: inputting the input clock signal to a pulse generator; generating a reset signal from the pulse generator based on the input clock signal; inputting the reset signal and a bias signal to a voltage controlled delay element; generating a modified reset signal from the voltage controlled delay element; generating the output clock signal from a clock signal adjustment device dependent on the modified reset signal and the input clock signal; inputting the output clock signal to a duty cycle controller; and generating the bias signal from the duty cycle controller.

According to another aspect, an apparatus for generating an output clock signal with a desired duty cycle dependent on an input clock signal comprises: a pulse generator having an input operatively connected to the input clock signal, where the pulse generator outputs a reset signal in response thereto; a voltage controlled delay element having an input operatively connected to a output of the pulse generator, where the voltage controlled delay element outputs a modified reset signal in response to a bias signal and the reset signal; a clock signal adjustment device having an input operatively connected to the input clock signal, where the clock signal adjustment device outputs the output clock signal in response to the modified reset signal and the input clock signal; and a duty cycle controller having an input operatively connected to an output of the clock signal adjustment device, where the duty cycle controller outputs the bias signal in response to the output clock signal.

According to another aspect, an apparatus for generating an output clock signal with a desired duty cycle dependent on an input clock signal comprises: means for generating a reset signal based on the input clock signal; means for generating a modified reset signal based on the reset signal and bias signal; means for generating the output clock signal based on the modified reset signal and the input clock signal; and means for generating the bias signal based on the output clock signal.

Other aspects and advantages of the invention will be apparent from the following description and the appended claims.

DETAILED DESCRIPTION

Figure 1:
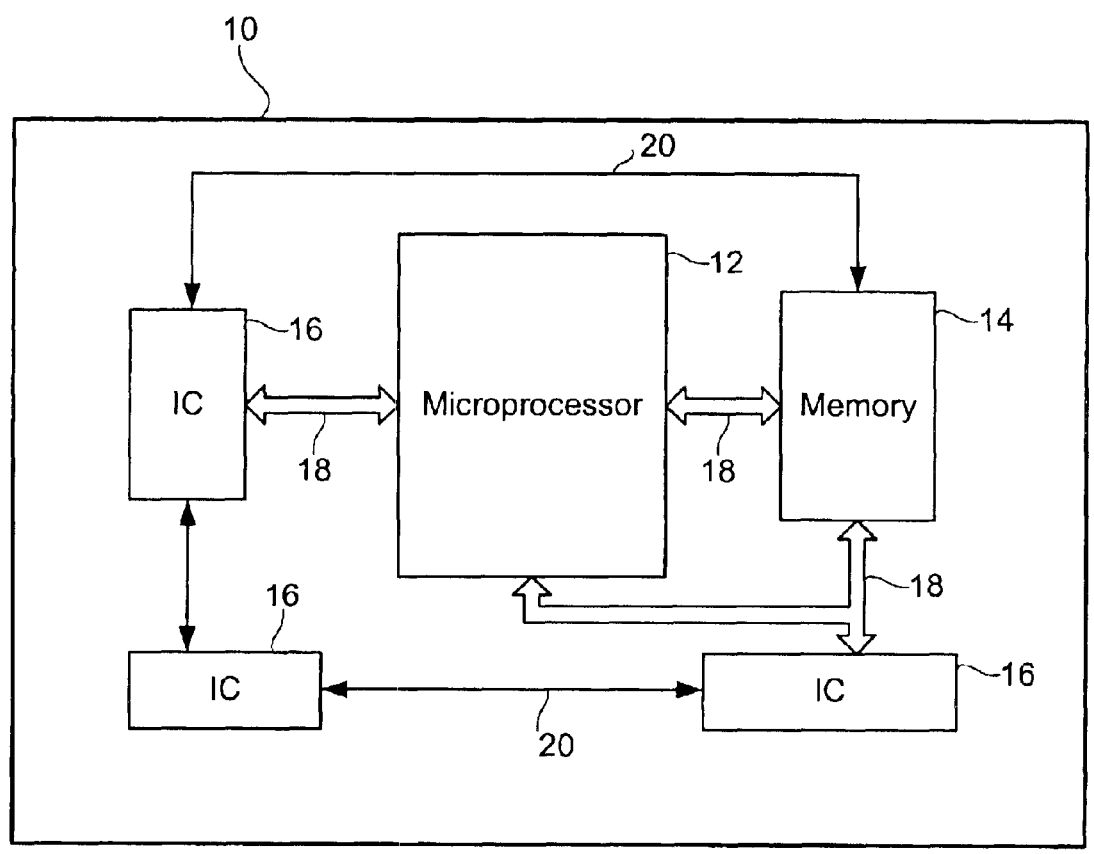
FIG. 1 shows a typical computer system.
Figure 2:
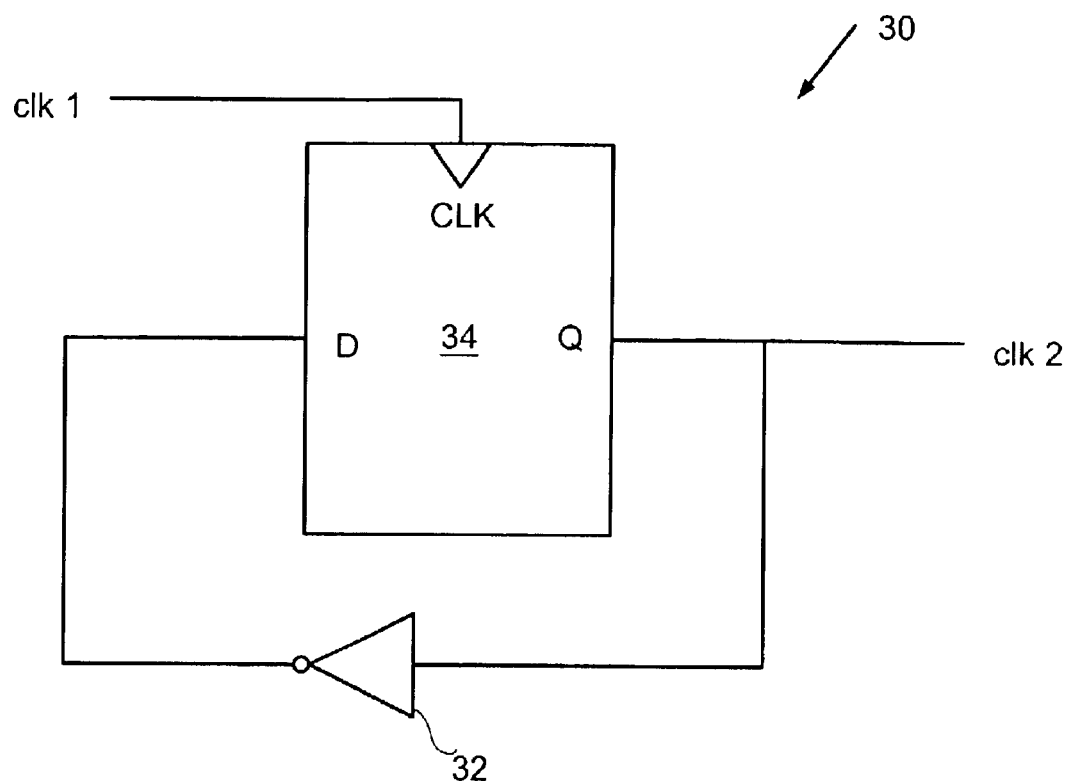
FIG. 2 shows a typical frequency divider.
Figure 3:
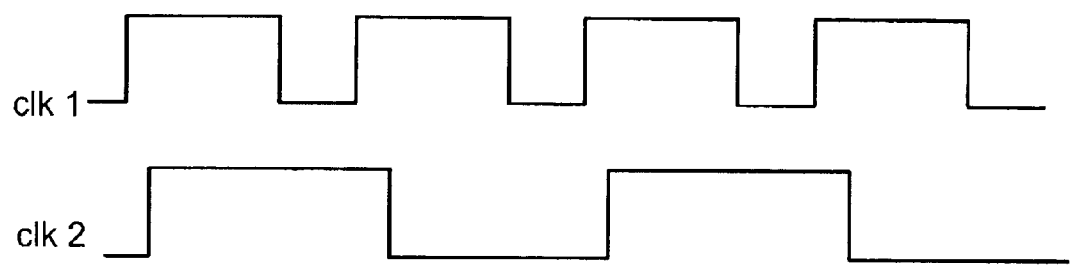
FIG. 3 shows a timing diagram of the typical frequency divider shown in FIG. 2.

Specific embodiments of the invention will now be described in detail with references to the accompanying figures. Like elements in the various figures are denoted by like reference numerals throughout the figures for consistency.

In the following detailed description of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Embodiments of the invention relate to a method and apparatus for correcting a duty cycle of a clock signal. A duty cycle correction device uses an output clock signal as a feedback input to increase or decrease the high time of the output clock signal. An analog biasing signal is increased or decreased based on the high time of the output clock signal. The biasing signal modifies the delay of a reset signal. The modified (sped up or delayed) reset signal controls the falling edge of the output clock signal. If the high time is greater than the desired duty cycle, the analog biasing signal decreases to speed up a reset signal. The modified reset clock signal speeds up the falling edge of the output clock signal, decreasing the high time. Conversely, if the high time is less than the desired duty cycle, the analog biasing signal is increased to delay a reset signal. The modified reset signal delays the falling edge of the output clock signal, increasing the high time.

Figure 4:
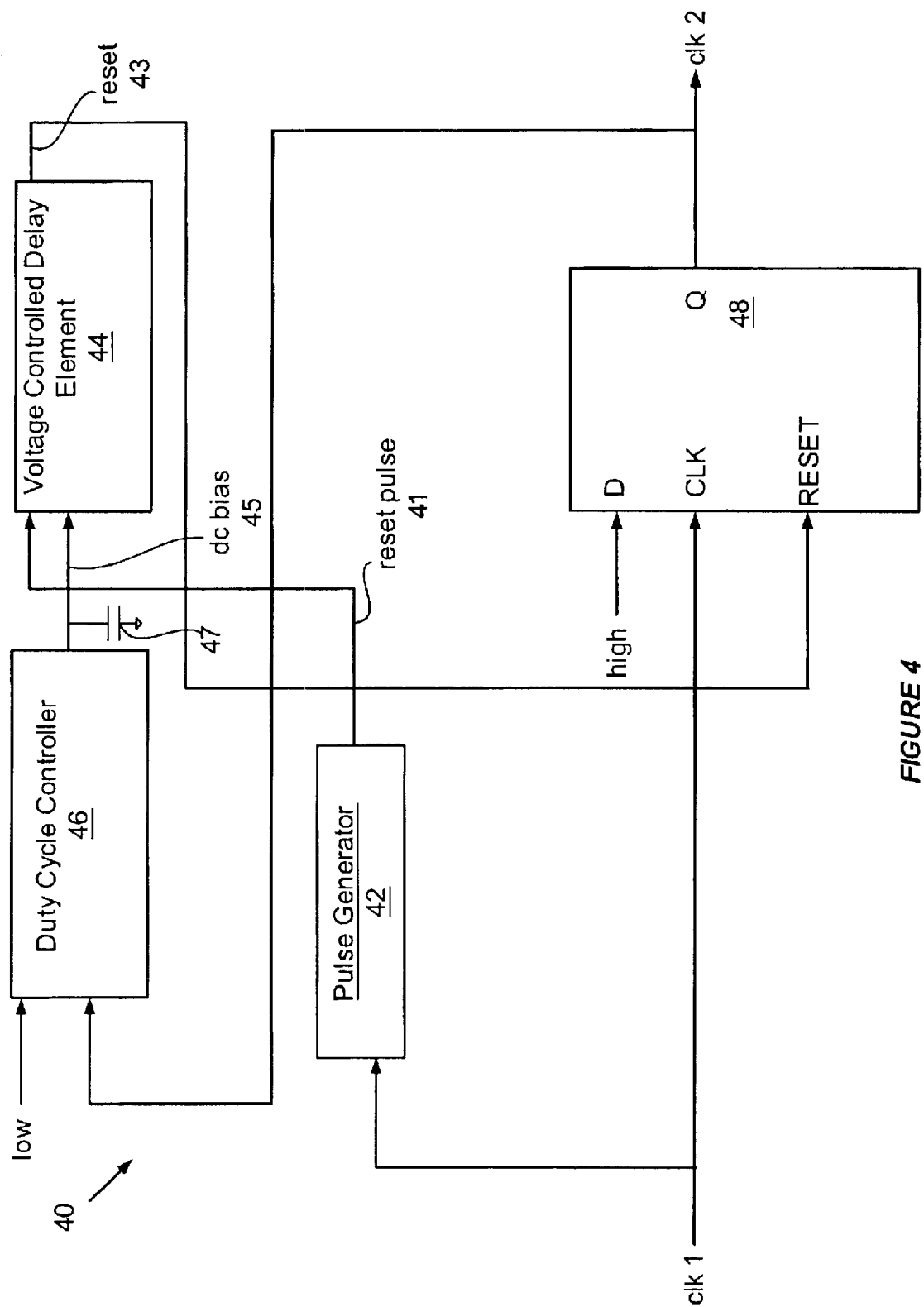
FIG. 4 shows a duty cycle correction device in accordance with an embodiment of the invention.

FIG. 4 shows an exemplary duty cycle correction device (40) in accordance with an embodiment of the present invention. The duty cycle correction device (40) includes several components. A first component is a pulse generator (42). The pulse generator (42) inputs an input clock signal (clk 1) and outputs a reset signal (reset pulse 41). A second component, namely a voltage controlled delay element (44), inputs the reset signal (reset pulse 41) and an analog signal, referred to as a bias signal (dc bias 45), and outputs a modified reset signal (reset 43). The bias signal (dc bias 45) is generated by a fourth component, the duty cycle controller (46). The duty cycle controller (46) inputs an output clock signal (clk 2) and outputs the bias signal (dc bias 45). The bias signal (dc bias 45) is connected further to a capacitor (47) that stabilizes the bias signal (dc bias 45). The output clock signal (clk 2) is generated by a clock signal adjustment device, e.g., an asynchronous resettable positive edge triggered flip-flop (48). The resettable positive edge triggered flip-flop (48) inputs high to an input data terminal (D) of the flip-flop (48), the input clock signal (clk 1) to a clock terminal (CLK) of the flip-flop (48), and the modified reset signal (reset 43) to a reset terminal (RESET) of the flip-flop (48). An output terminal (Q) of the flip-flop (48) outputs the output clock signal (clk 2).

The output (Q) of the flip-flop (48) transitions to low when the modified reset signal (reset 43) goes high regardless of the state of the input clock signal (clk 1). The output terminal (Q) maintains the current state in the event the reset terminal (RESET) is not triggered. Therefore, delaying the falling edge of the modified reset signal (reset 43) lengthens the interval of time in which the flip flop (48) maintains a high state. The output clock signal transitions low when the modified reset signal (reset 43) transitions high. Conversely, speeding up the falling edge of the modified reset signal (reset 43) shortens the interval of time in which the flip-flop (48) maintains the high state.

The input clock signal (clk 1) and the modified reset signal (reset 43) determine the output clock signal (clk 2) of the flip-flop (48), i.e., the modified reset signal (reset 43) controls the duty cycle of the output clock signal (clk 2). The pulse generator (42), the voltage controlled delay element (44), and the duty cycle controller (46) operate in conjunction to generate the modified reset signal (reset 43).

Figure 5:
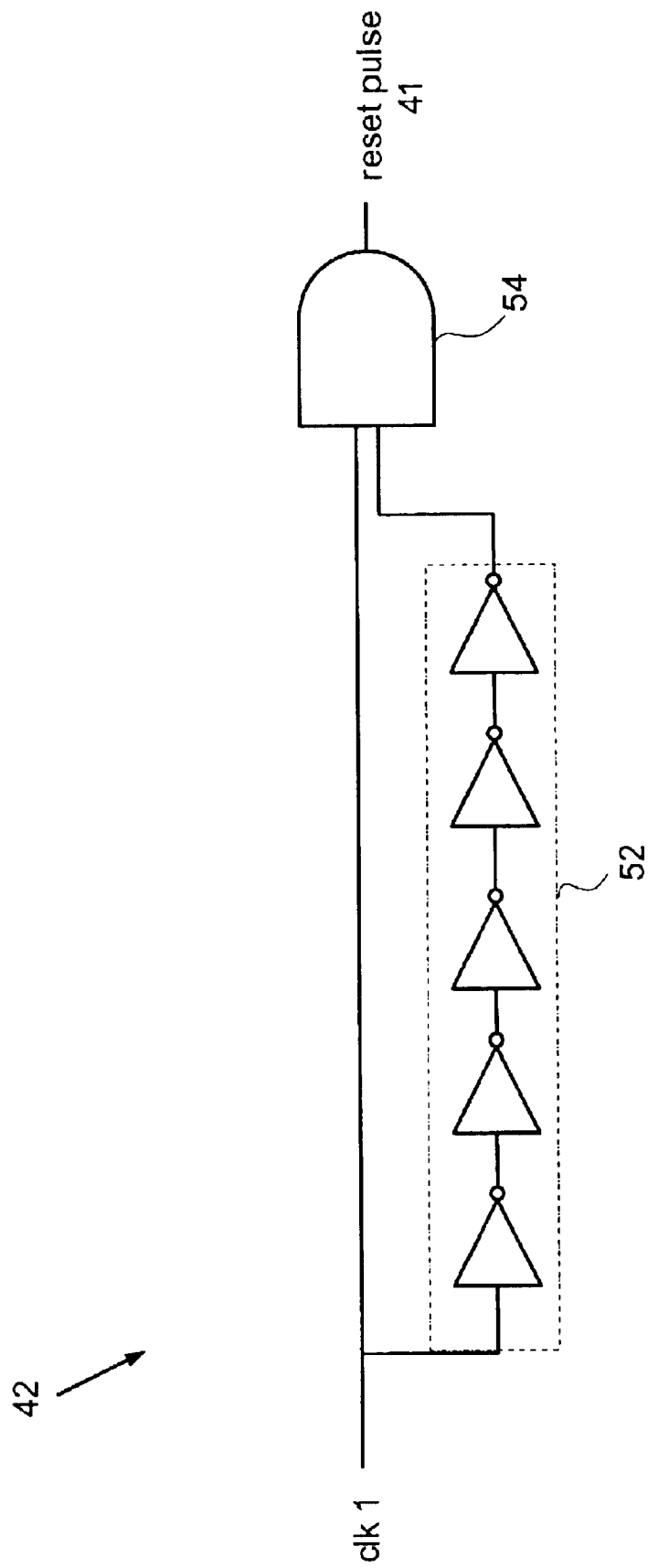
FIG. 5 shows a pulse generator in accordance with one embodiment of the invention.

The pulse generator (42) generates a reset signal (reset pulse 41) that pulses for every rising edge of the input signal clock (clk 1). FIG. 5 shows an exemplary pulse generator (42) in accordance with one embodiment of the present invention. The pulse generator includes a delay element (52) and a gate, e.g., AND gate (54). The input clock signal (clk 1) is input to the delay element (52), which is a series of an odd number of inverters. The delay element (52) produces a slight delay and inverts the input clock signal (clk 1). The AND gate (54) inputs the input clock signal (clk 1) and the delayed, inverted input clock signal (clk 1). The AND gate (54) only produces the high output when both the input clock signal (clk 1) and the delayed, inverted input clock signal (clk 1) are high. In this manner, pulses are generated for every rising edge of the input clock signal (clk 1). One skilled in the art will appreciate that a pulsed signal, namely the reset signal (reset pulse 41), may be produced by a pulse generator (42) in many ways.

Figure 6:
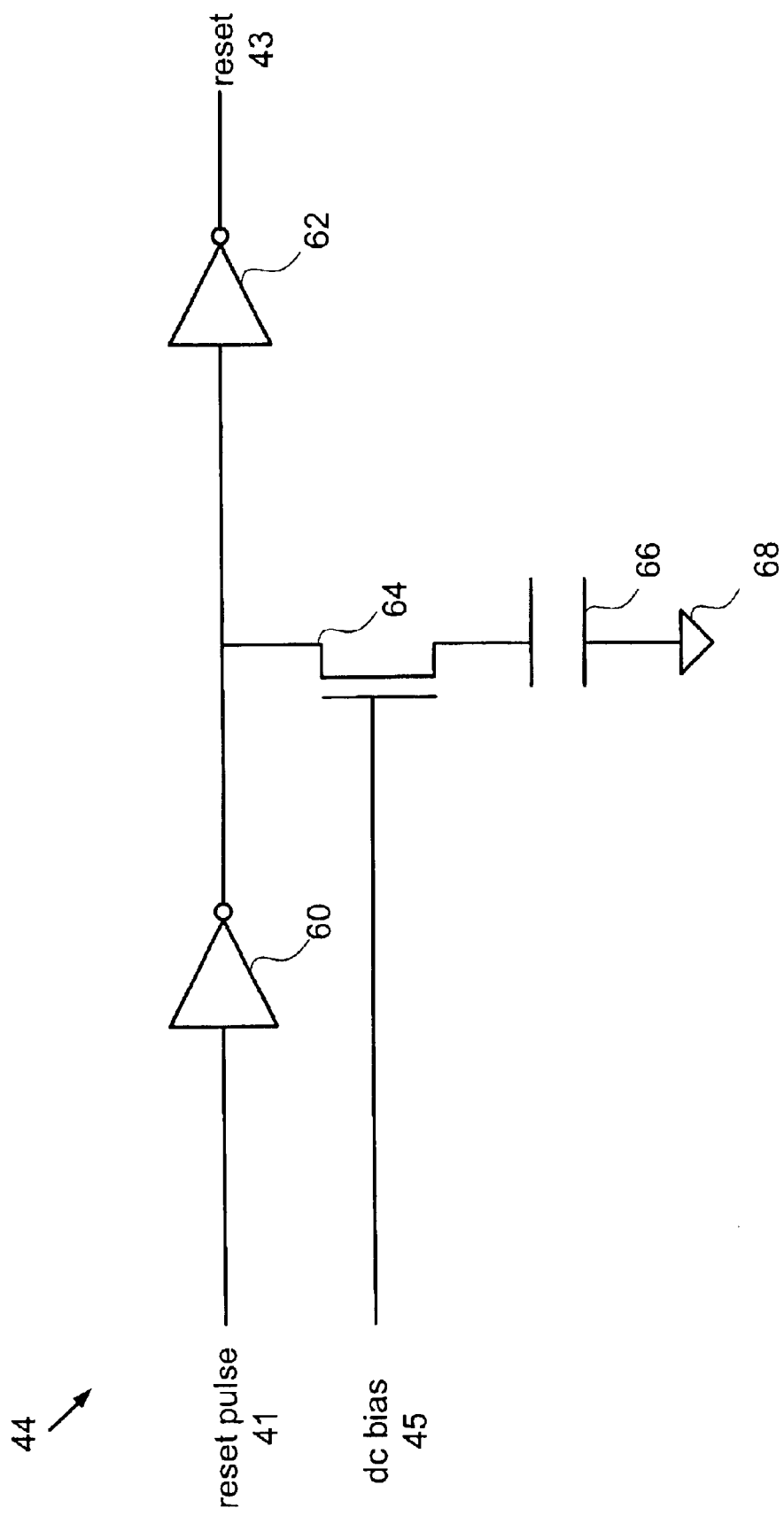
FIG. 6 shows a voltage controlled delay element in accordance with one embodiment of the invention.

Both the reset signal (reset pulse 41) produced by the pulse generator (42) and the bias signal (dc bias 45) are input to the voltage controlled delay element (44). FIG. 6 shows an exemplary voltage controlled delay element in accordance with one embodiment of the invention. The voltage controlled delay element (44) includes two inverters (60, 62), an N-channel transistor (64), and a capacitive load (66). The reset signal (reset pulse 41) is input to the first inverter

(60) and the bias signal (dc bias 45) is input to the gate of the N-channel transistor (64). The inverter (60) inverts the reset signal (reset pulse 41).

The N-channel transistor (64) is considered "off" when the bias signal (dc bias 45) is low and "on" when the bias signal (dc bias 45) is high. If the N-channel transistor (64) is "on," the first inverter (60) "sees" more of the capacitive load (66), and thus the reset signal (reset pulse 41) is slowed. Conversely, if the N-channel transistor (64) is "off," the first inverter "sees" less of the capacitive load (66), and thus the reset signal (reset pulse 41) is not slowed down. The dc bias signal (dc bias 45) may vary from 0 to Vdd, and the delay of the reset signal (reset pulse 41) will change accordingly in an analog manner.

The second inverter (62) inputs the modified (delayed or sped up), inverted reset signal (reset pulse 41), inverts the modified, inverted signal, and outputs the modified reset signal (reset 43). One skilled in the art will appreciate a modified reset signal (reset 43) may be produced by a voltage controlled delay element (44) in many ways.

Figure 7:
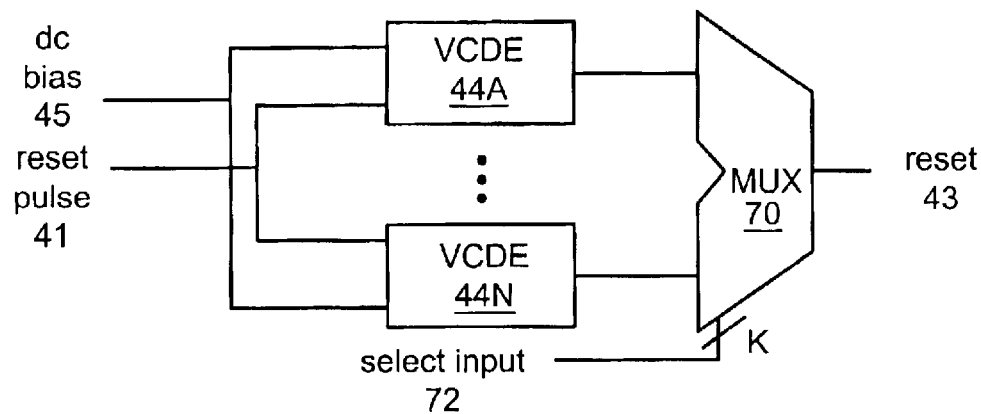
FIG. 7 shows a plurality of voltage controlled delay elements in accordance with one embodiment of the invention.

In another embodiment, a plurality of voltage controlled delay elements are used to generate the modified reset signal (reset 43). FIG. 7 shows a plurality of voltage controlled delay elements in accordance with embodiment of the present invention. A plurality of voltage controlled delay elements (44A ... 44N), a multiplexer (70), and a select signal (select input 72) are used to generate the modified reset signal (reset 43). The reset signal (reset pulse 41) is input to each of the voltage controlled delay elements (44A ... 44N), which produce different magnitudes in the delaying (or speeding up) of the reset signal (reset pulse 41). The multiplexer (70) inputs the outputs from the respective voltage controlled delay elements (44A ... 44N) to data input terminals. The multiplexer (70) is a circuit used to select a particular signal amongst a plurality of signals based on the select signal (select input 72) of the controller input terminal. The select signal (select input 72) controls the selection of the modified reset signal (reset 43) produced by voltage controlled delay element (44A) or voltage controlled delay element (44N).

Figure 8:
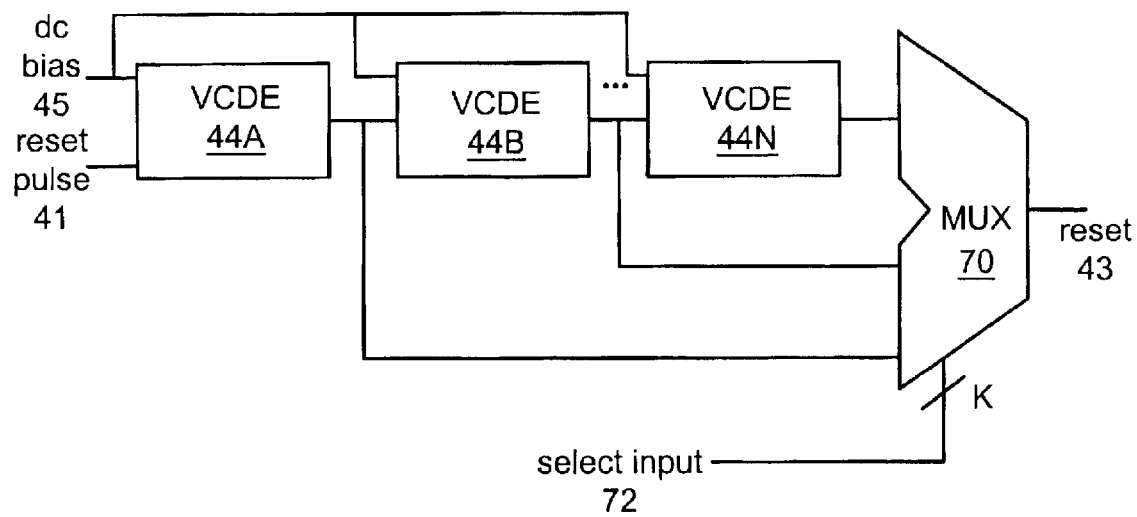
FIG. 8 shows a plurality of voltage controlled delay elements in accordance with another embodiment of the invention.

In another embodiment, a plurality of cascaded voltage controlled delay elements are used to generate the modified reset signal (reset 43). FIG. 8 shows a plurality of voltage controlled delay element in accordance with this embodiment of the present invention. A plurality of cascaded voltage controlled delay elements (44A, 44B ... 44N), a multiplexer (70), and a select signal (select input 72) are used to generated the modified reset signal (reset 43). The reset signal (reset pulse 41) is input to the voltage controlled delay element (44A). The output of the voltage controlled delay element (44A) is input to the voltage controlled delay element (44B) and is input to the multiplexer (70). The output of the voltage controlled delay element (44B) is input to the voltage controlled delay element (44N) and is input to the multiplexer (70). The output of voltage controlled delay element (44N) is input to the multiplexer. The multiplexer (70) inputs the outputs from the respective voltage controlled delay elements (44A, 44B ... 44N) to data input terminals and the select signal (select input 72). The select signal (select input 72) controls the selection of the modified reset signal (reset 43) produced by voltage controlled delay element (44A), voltage controlled delay element (44B), or voltage controlled delay element (44N).

The bias signal (dc bias 45), mentioned above as an input to the voltage controlled delay element, is generated by the duty cycle controller (46). The duty cycle controller (46) inputs the low and the output clock signal (clk 2) and outputs the bias signal (dc bias 45). If the high time of the output clock signal is greater than the desired duty cycle, the duty cycle controller decreases the voltage of the bias signal (dc bias 45). If the high time of the output clock signal is less than the desired duty cycle, the duty cycle controller increases the voltage of the bias signal (de bias 45). One skilled in the art can appreciate that a bias signal (de bias 45) may be produced by a duty cycle controller (46) in many ways.

Figure 9:
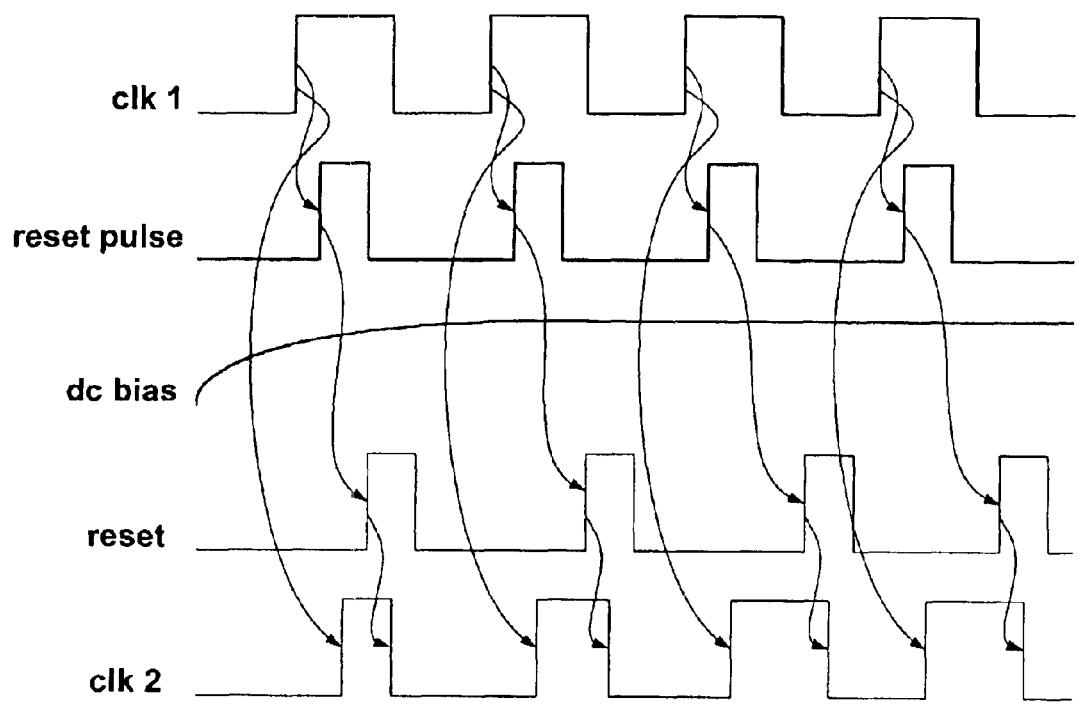
FIG. 9 shows a timing diagram of a duty cycle correction device in accordance with one embodiment of the invention.

FIG. 9 shows an exemplary timing diagram of a duty cycle correction device in accordance with one embodiment of the present invention. A set of five signals are shown: the input clock signal (clk 1), the reset signal (reset pulse 41), the modified reset signal (reset 43), the output clock signal (clk 2), and the bias signal (dc bias 45). In FIG. 9, the high time of the duty cycle is increased. The input clock signal (clk 1) maintains regulated transitions from high to low and low to high. The reset signal (reset pulse 41) generated by the pulse generator (42) transitions to high for every rising edge of the input clock signal (clk 1). The reset signal (reset pulse 41) is a series of regulated pulses. The voltage controlled delay element (44) inputs the bias signal (de bias 45) (generated by the duty cycle controller (46)) and outputs the modified reset signal (reset 43) with a gradual delay. Thus the rising edge and the falling edge of the modified reset signal (reset 43) is delayed substantially. Therefore, the flip-flop (48) delays the falling edge of the output clock signal (clk 2). Increasing the high time of the output clock signal (clk 2) produces the desired duty cycle.

Figure 10:
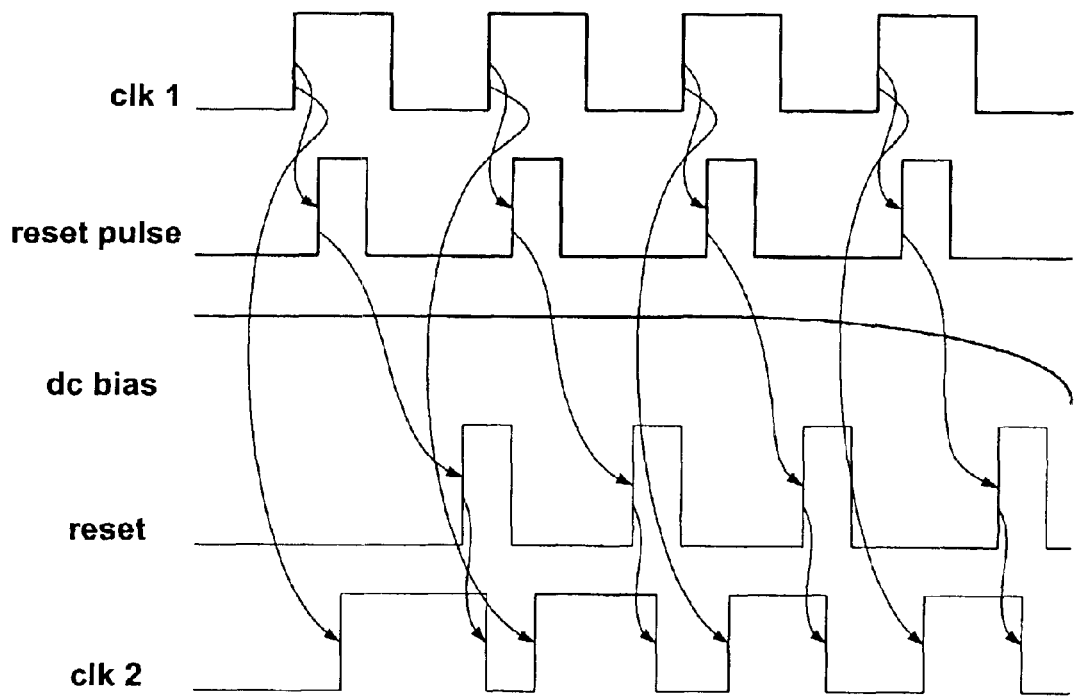
FIG. 10 shows a timing diagram of a duty cycle correction device in accordance with another embodiment of the invention.

FIG. 10 shows an exemplary timing diagram of a duty cycle correction device in accordance with another embodiment of the present invention. A set of five signals are shown: the input clock signal (clk 1), the reset signal (reset pulse 41), the modified reset signal (reset 43), the output clock signal (clk 2), and the bias signal (dc bias 45). In FIG. 10, the high time of the duty cycle is decreased. The input clock signal (clk 1) maintains regulated transitions from high to low and low to high. The reset signal (reset pulse 41) generated by the pulse generator (42) transitions to high for every rising edge of the input clock signal (clk 1). The reset signal (reset pulse 41) is a series of regulated pulses. The voltage controlled delay element (44) inputs the bias signal (de bias 45) (generated by the duty cycle controller (46)) and outputs the modified reset signal (reset 43) that is sped up, thus the falling edge of the modified reset signal (reset 43) is sped up substantially. Therefore, the flip-flop (48) speeds the rising edge and the falling edge of the output clock signal (clk 2). Decreasing the high time of the output clock signal (clk 2) produces the desired duty cycle.

Embodiments of the invention use a pulse generator, a voltage controlled delay element, a duty cycle controller, and a duty cycle adjustment device such that the output signal generated has a desired duty cycle. Advantages of the invention may include one or more of the following. In one or more embodiments, the duty cycle correction device may be a module integrated into a PLL or DLL, or the module may precede or follow the PLL or DLL.

In one or more embodiments of the present invention, a plurality of desired duty cycles may be produced. For example, a signal may have a high time 60% of the time and a low time 40% of the time or the signal may have a high time 70% of the time and a low time 30% of the time. One skilled in the art can appreciate there are many combinations of high times and low times for desired duty cycles that may be produced.

In one or more embodiments, the frequency of an input clock signal does not need modification to produce the desired duty cycle. Therefore, the input clock signal does not require a particular frequency in order to generate the desired duty cycle. Those skilled in the art will appreciate that the invention may also include other advantages and features.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A duty cycle correction device for generating an output clock signal with a desired duty cycle based on an input clock signal, comprising:
   a pulse generator that inputs the input clock signal and generates a reset signal;
   a voltage controlled delay element that inputs the reset signal and a bias signal and generates a modified reset signal;
   a flip-flop configured to generate the output clock signal, wherein the input clock signal and the modified reset signal serve as an inputs to the flip-flop; and
   a duty cycle controller that inputs the output clock signal and generates the bias signal therefrom.

2. The duty cycle correction device of claim 1, wherein the duty cycle controller monitors a high time of the output clock signal and adjusts the bias signal in response thereto.

3. The duty cycle correction device of claim 1, wherein the pulse generator comprises:
   a delay element that generates an inverted, delayed input clock signal based on the input clock signal; and
   circuitry that generates the reset signal based on the input clock signal and the inverted, delayed input clock signal.

4. The duty cycle correction device of claim 1, wherein the voltage controlled delay element comprises:
   a first inverter that generates an inverted, delayed reset signal based on the reset signal;
   circuitry responsive to the bias signal; and
   a second inverter that generates the modified reset signal based on the inverted, delayed reset signal and the circuitry.

5. The duty cycle correction device of claim 1, wherein the voltage controlled delay element further comprises:
   a plurality of voltage controlled delay elements that generate a plurality of modified reset signals based on the reset signal and the bias signal; and
   a multiplexer that generates the modified reset signal based on the plurality of modified reset signals and a select signal.

6. The duty cycle correction device of claim 1, wherein the flip-flop comprises:
   an asynchronous resettable flip-flop that generates the output clock signal based on the input clock signal and the modified reset signal.

7. A method for generating an output clock signal with a desired duty cycle based on an input clock signal comprising:
   inputting the input clock signal to a pulse generator;
   generating a reset signal from the pulse generator based on the input clock signal;
   inputting the reset signal and a bias signal to a voltage controlled delay element;
   generating a modified reset signal from the voltage controlled delay element;
   generating the output clock signal from a flip-flop, wherein the input clock signal and the modified reset signal serve as an inputs to the flip-flop;
   inputting the output clock signal to a duty cycle controller; and
   generating the bias signal from the duty cycle controller.

8. The method of claim 7, wherein generating the bias signal comprises:
   monitoring a high time of the output clock signal and adjusting the bias signal in response thereto.

9. The method of claim 7, wherein generating the reset signal using the pulse generator comprises:
   generating an inverted, delayed input clock signal using a delay element dependent on the input clock signal; and
   generating the reset signal using circuitry dependent on the input clock signal and the inverted, delayed clock signal.

10. The method of claim 7, wherein generating the modified reset signal using the voltage controlled delay element comprises:
    generating an inverted, delayed reset signal from a first inverter dependent on the reset signal; and
    generating a modified reset signal from a second inverter dependent on the inverted, delayed reset signal and circuitry dependent on the bias signal.

11. The method of claim 7, wherein the generating the modified reset signal comprises:
    inputting the reset signal and the bias signal to a plurality of voltage controlled delay elements;
    generating a plurality of modified reset signals using the plurality of voltage controlled delay elements;
    inputting the plurality of modified reset signals and select signals to a multiplexer; and
    generating the modified reset signal using the multiplexer.

12. The method of claim 7, wherein the generating the output clock signal using the flip-flop comprises:
    inputting the input clock signal and the modified reset signal to a resettable flip-flop; and
    generating the output clock signal from the resettable flip-flop.

13. An apparatus for generating an output clock signal with a desired duty cycle dependent on an input clock signal, comprising:
    means for generating a reset signal based on the input clock signal;
    means for generating a modified reset signal based on the reset signal and a bias signal, wherein a delay of the means for generating is controlled by the bias signal;
    a flip-flop for generating the output clock signal, wherein the input clock signal and the modified reset signal serve as an inputs to the flip-flop; and
    means for generating the bias signal based on the output clock signal.

14. An apparatus for generating an output clock signal with a desired duty cycle dependent on an input clock signal, comprising:
    a pulse generator having an input operatively connected to the input clock signal, wherein the pulse generator outputs a reset signal in response thereto;
    a voltage controlled delay element having an input operatively connected to an output of the pulse generator, wherein the voltage controlled delay element outputs a modified reset signal in response to a bias signal and the reset signal;

a flip-flop having an input operatively connected to the input clock signal, wherein the flip-flop outputs the output clock signal in response to the modified reset signal and the input clock signal, wherein the modified reset signal and the input clock signal serve as inputs to the flip-flop; and a duty cycle controller having an input operatively connected to an output of the flip-flop, wherein the duty cycle controller outputs the bias signal in response to the output clock signal.

15. The apparatus of claim 14, wherein the output of the duty cycle controller is operatively connected to a capacitance.

* * * * *